(12) United States Patent
Liu et al.

(10) Patent No.: US 11,201,567 B2
(45) Date of Patent: Dec. 14, 2021

(54) VEHICLE AND CONTROL METHOD THEREOF AND SYSTEM

(71) Applicant: General Electric Company, Schenectady, NY (US)

(72) Inventors: Changjin Liu, Shanghai (CN); Fei Li, Shanghai (CN); Tao Wu, Shanghai (CN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 68 days.

(21) Appl. No.: 16/605,842

(22) PCT Filed: Apr. 17, 2018

(86) PCT No.: PCT/US2018/027849
§ 371 (c)(1),
(2) Date: Oct. 17, 2019

(87) PCT Pub. No.: WO2018/195003
PCT Pub. Date: Oct. 25, 2018

(65) Prior Publication Data
US 2020/0076326 A1    Mar. 5, 2020

(30) Foreign Application Priority Data
Apr. 20, 2017    (CN) .......................... 201710260910.7

(51) Int. Cl.
*H02P 29/10*    (2016.01)
*G01R 31/36*    (2020.01)
(Continued)

(52) U.S. Cl.
CPC ........ H02M 7/53875 (2013.01); G01R 31/36 (2013.01); H02M 1/32 (2013.01);
(Continued)

(58) Field of Classification Search
USPC ......................................................... 318/560
See application file for complete search history.

(56) References Cited

U.S. PATENT DOCUMENTS 3,641,539 A * 2/1972 Lesher .................. G08B 25/00
340/549
4,310,866 A * 1/1982 Wirth ...................... H02M 1/38
361/88

(Continued)

FOREIGN PATENT DOCUMENTS

CN    102208888 A    10/2011
CN    102998588 A    3/2013
(Continued)

OTHER PUBLICATIONS

International Search Report for PCT/US2018/027849, dated Jul. 5, 2018.
(Continued)

*Primary Examiner* — Bentsu Ro
(74) *Attorney, Agent, or Firm* — Meagher Emanuel; Laks Goldberg & Liao, LLP

(57) ABSTRACT

The present invention discloses a vehicle. The vehicle includes an AC electric machine configured to generate traction driving force, a DC bus configured to provide a DC voltage, an inverter, and a controller. The inverter is coupled with the DC bus and configured to convert the DC voltage from the DC bus to an AC voltage to drive the AC electric machine, and the inverter includes a plurality of transistors. The controller is configured to control the inverter to maintain the vehicle to run in a fault-tolerant mode when an open circuit fault occurs in one of the transistors in the inverter during running of the vehicle. The present invention further discloses a control method of the vehicle and a system.

17 Claims, 7 Drawing Sheets

(51) Int. Cl.
*H02M 7/5387* (2007.01)
*H02P 29/024* (2016.01)
*H02P 29/032* (2016.01)
*H02M 1/32* (2007.01)
*H02P 27/06* (2006.01)

(52) U.S. Cl.
CPC .......... *H02P 27/06* (2013.01); *H02P 29/0241* (2016.02); *H02P 29/032* (2016.02); *H02P 29/10* (2016.02); *H02M 2001/325* (2013.01)

(56) References Cited

U.S. PATENT DOCUMENTS

| | | | |
|---|---|---|---|
| 4,456,908 A | * | 6/1984 | Morroll .................. G08C 19/30 340/644 |
| 7,279,862 B1 | | 10/2007 | Welchko et al. |
| 8,476,853 B2 | | 7/2013 | Vanko et al. |
| 2007/0016340 A1 | | 1/2007 | Soudier et al. |
| 2008/0304189 A1 | | 12/2008 | Tang et al. |
| 2010/0295500 A1 | | 11/2010 | Chakrabarti et al. |
| 2012/0262098 A1 | | 10/2012 | Vollmer et al. |
| 2012/0303189 A1 | * | 11/2012 | Namuduri ........... B60W 50/029 701/22 |
| 2012/0313564 A1 | | 12/2012 | Guitard et al. |
| 2013/0147404 A1 | | 6/2013 | Kim et al. |
| 2014/0191700 A1 | | 7/2014 | Eberlein et al. |
| 2015/0346276 A1 | | 12/2015 | Liu et al. |
| 2016/0258993 A1 | | 9/2016 | Bagchi et al. |
| 2018/0337590 A1 | * | 11/2018 | He .......................... H02M 1/32 |
| 2020/0076326 A1 | * | 3/2020 | Liu ....................... G01R 31/006 |
| 2020/0285900 A1 | * | 9/2020 | He ........................ G06K 9/6257 |

FOREIGN PATENT DOCUMENTS

| | | |
|---|---|---|
| CN | 103869208 A | 6/2014 |
| EP | 2048774 A2 | 4/2009 |
| WO | 20170053331 A1 | 3/2017 |

OTHER PUBLICATIONS

Written Opinion for PCT/US2018/027849, dated Jul. 5, 2018.
European Search Report for corresponding European Application No. 18/787,396, dated Dec. 21, 2020.

* cited by examiner

VEHICLE AND CONTROL METHOD THEREOF AND SYSTEM

TECHNICAL FIELD

The present invention generally relates to the field of control, and in particular, to a vehicle capable of fault-tolerant control when a fault occurs in an inverter during running of the vehicle and a control method thereof, and a system capable of fault-tolerant control when a fault occurs in an inverter during running of an AC electric machine.

BACKGROUND ART

Recently, since fuel energy resources are increasingly exhausted and air environmental pollution is increasingly severe, environment friendly vehicles, for example, blade electric vehicles and hybrid electric vehicles have attracted much attention. These vehicles are usually equipped with a power storage device (for example, a secondary battery, a fuel cell, a capacitor, and the like), and use power stored in the power storage device to generate traction driving force to drive the vehicles to run.

In these vehicles, an inverter is generally used to convert DC power from the power storage device into AC power for driving a rotating electric machine such as a motor generator. In addition, when the driving force generated by the rotating electric machine is used to drive a vehicle, braking force from driving wheels of the vehicle, the engine, and the like can be converted into electric energy to charge the power storage device during regenerative braking.

However, the inverter is most likely to experience a fault in the driving system of the electric vehicle. A common fault for the inverter is an open circuit fault occurring in a transistor in the inverter. It is well-known that a motor at a high speed, such as a permanent magnetic motor, will cause excessively high counter electromotive force when an inverter broke down. In this case, a peak current and high torque ripple on a stator side of the motor will occur.

One of existing vehicle control methods usually stops the inverter directly after the inverter fails. However, if the inverter is stopped, the power storage device cannot provide driving force for the rotating electric machine via the inverter. Consequently, in an electric vehicle that loses driving force of a rotating electric machine, the vehicle can only run by inertia, and when inertial running is completed and the vehicle stops, the vehicle cannot drive by its own power. As a result, it is possible to cause traffic jams because the vehicle cannot move on the road, or the vehicle cannot arrive at a repair place, but have to use a trailer.

Another existing vehicle control method is to use a redundant phase arm or circuit so as to bypass the failed phase arm in the inverter after the inverter fails, and directly use the redundant phase arm or circuit. However, this will inevitably increase costs of the product.

Therefore, it is necessary to provide an improved control method for a vehicle to solve at least one of the problems described above.

SUMMARY

An aspect of the present invention provides a vehicle. The vehicle includes an AC electric machine configured to generate traction driving force, a DC bus configured to provide a DC voltage, an inverter, and a controller. The inverter is coupled with the DC bus and configured to convert the DC voltage from the DC bus to an AC voltage to drive the AC electric machine, and the inverter includes a plurality of transistors. The controller is configured to control the inverter to maintain the vehicle to run in a fault-tolerant mode when an open circuit fault occurs in one of the transistors in the inverter during running of the vehicle.

Another aspect of the present invention provides a control method of a vehicle. The control method includes: providing a DC voltage; converting, by an inverter, the DC voltage to an AC voltage to drive an AC electric machine; generating, by the AC electric machine, traction driving force to drive the vehicle; and controlling the inverter to maintain the vehicle to run in a fault-tolerant mode when an open circuit fault occurs in one of the transistors in the inverter during running of the vehicle.

Still another aspect of the present invention provides a system. The system includes an AC electric machine configured to generate driving force, a DC bus configured to provide a DC voltage, an inverter, and a controller. The inverter is coupled with the DC bus and configured to convert the DC voltage from the DC bus to an AC voltage to drive the AC electric machine, and the inverter includes a plurality of transistors. The controller is configured to control the inverter to maintain the AC electric machine to operate in a fault-tolerant mode when an open circuit fault occurs in one of the transistors in the inverter during operating of the AC electric machine.

BRIEF DESCRIPTION OF THE DRAWINGS

These and other features, aspects and advantages of the present invention will become better understood when the following detailed description is read with reference to the accompanying drawings, in which like reference numerals are used throughout the drawings to refer to like parts, where.

PREFERRED EMBODIMENTS

The specific embodiments of the present invention will be described in detail below with reference to the accompanying drawings in order to facilitate those skilled in the art to fully understand the subject matter claimed by the present invention. In the following detailed description of these specific embodiments, the present specification does not describe in detail any of the known functions or configurations, to avoid unnecessary details that may affect the disclosure of the present invention.

Unless otherwise defined, the technical and scientific terms used in the claims and the specification are as they are usually understood by those skilled in the art to which the present invention pertains. "First", "second" and similar words used in the specification and the claims do not denote any order, quantity or importance, but are merely intended to distinguish between different constituents. The terms "one", "a" and similar words are not meant to be limiting, but rather denote the presence of at least one. "Comprising", "consisting of" and similar words mean that the elements or articles appearing before "comprising" or "consisting of" include the elements or articles and their equivalent elements appearing behind "comprising" or "consisting of", not excluding any other elements or articles. "Connected", "coupled" and similar words are not restricted to physical or mechanical connections, but may also include electrical connections, whether direct or indirect.

Figure 1:
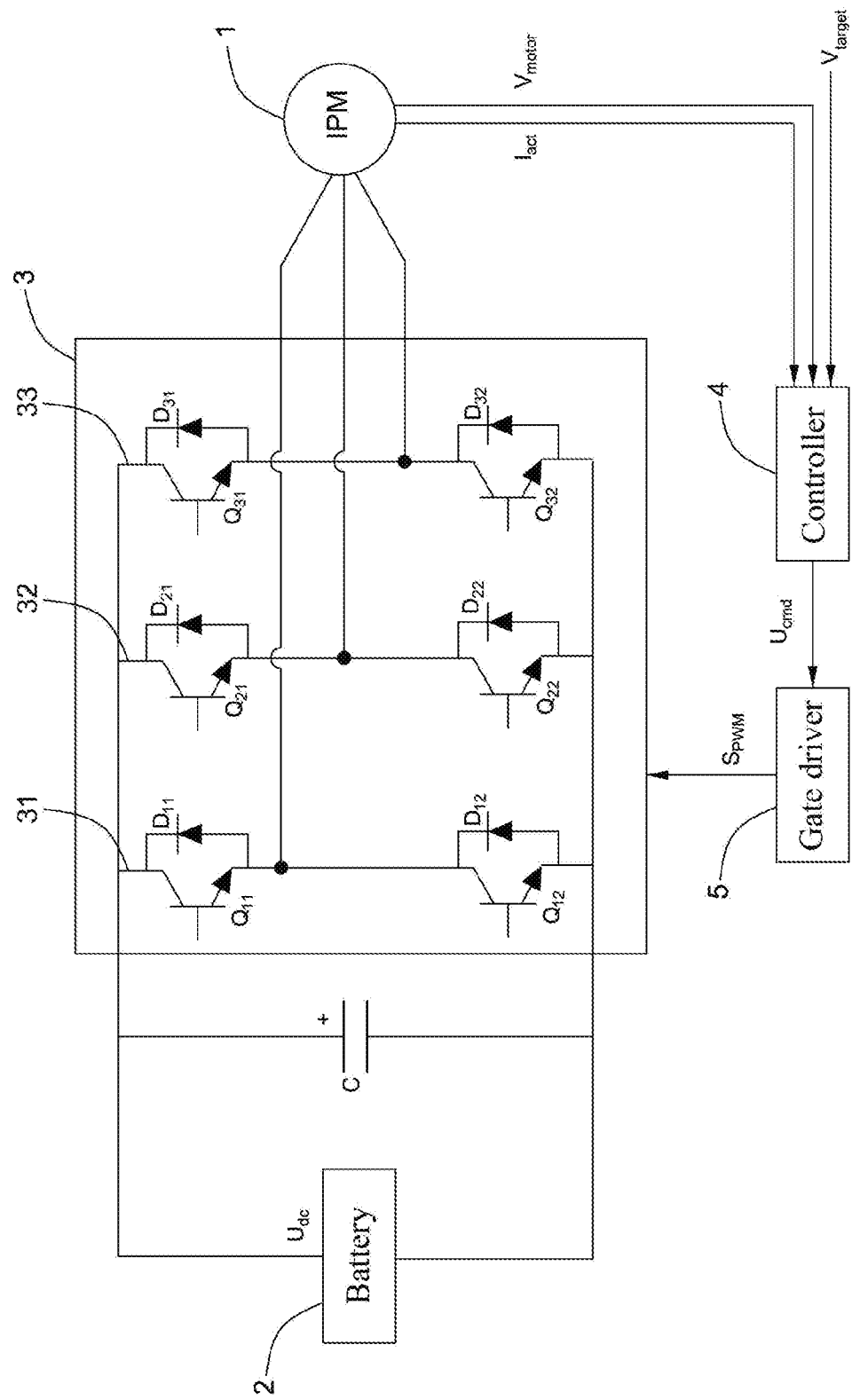
FIG. 1 is a schematic block diagram of an electric machine drive system of a vehicle according to a specific embodiment of the present invention.

FIG. 1 shows a schematic block diagram of an electric machine drive system of a vehicle according to a specific embodiment of the present invention. As shown in FIG. 1, the vehicle includes an AC electric machine 1 configured to generate traction driving force. The vehicle may include but is not limited to an electric vehicle, hybrid electric vehicle, and the like. The AC electric machine 1 may include, for example, an interior permanent magnet motor (IPM) or an induction motor (IM). In the present invention, the IPM is shown as an example. The AC electric machine 1 may be, for example, a three-phase AC motor.

The vehicle further includes a DC bus (DC bus, in this specific embodiment of the present invention, a battery 2 is shown as an illustrative example) configured to provide a DC voltage $U_{dc}$, an inverter 3, and a controller 4. The inverter 3 is coupled with the battery 2 and configured to convert the DC (Direct Current) voltage from the battery 2 to an AC (Alternating Current) voltage to drive the AC electric machine 1. A capacitor C is connected in parallel between the battery 2 and the inverter 3.

The inverter 3 includes a plurality of transistors. The inverter 3 may be, for example, a three-phase inverter, and includes three bridge arms 31, 32, and 33. Each bridge arm has two transistors in series and two diodes, and each transistor is connected in anti-parallel with one diode. For example, the bridge arm 31 includes two transistors $Q_{11}$, $Q_{12}$ in series and two diodes $D_{11}$, $D_{12}$ connected in anti-parallel with the transistors $Q_{11}$, $Q_{12}$; the bridge arm 32 includes two transistors $Q_{21}$, $Q_{22}$ in series and two diodes $D_{21}$, $D_{22}$ connected in anti-parallel with the transistors $Q_{21}$, $Q_{22}$; the bridge arm 33 includes two transistors $Q_{31}$, $Q_{32}$ in series and two diodes $D_{31}$, $D_{32}$ connected in anti-parallel with the transistors $Q_{31}$, $Q_{32}$. Each phase of the three-phase electric machine 1 is connected to connection points of two transistors in series in one of the bridge arms 31, 32, and 33 of the inverter 3.

Figure 2:
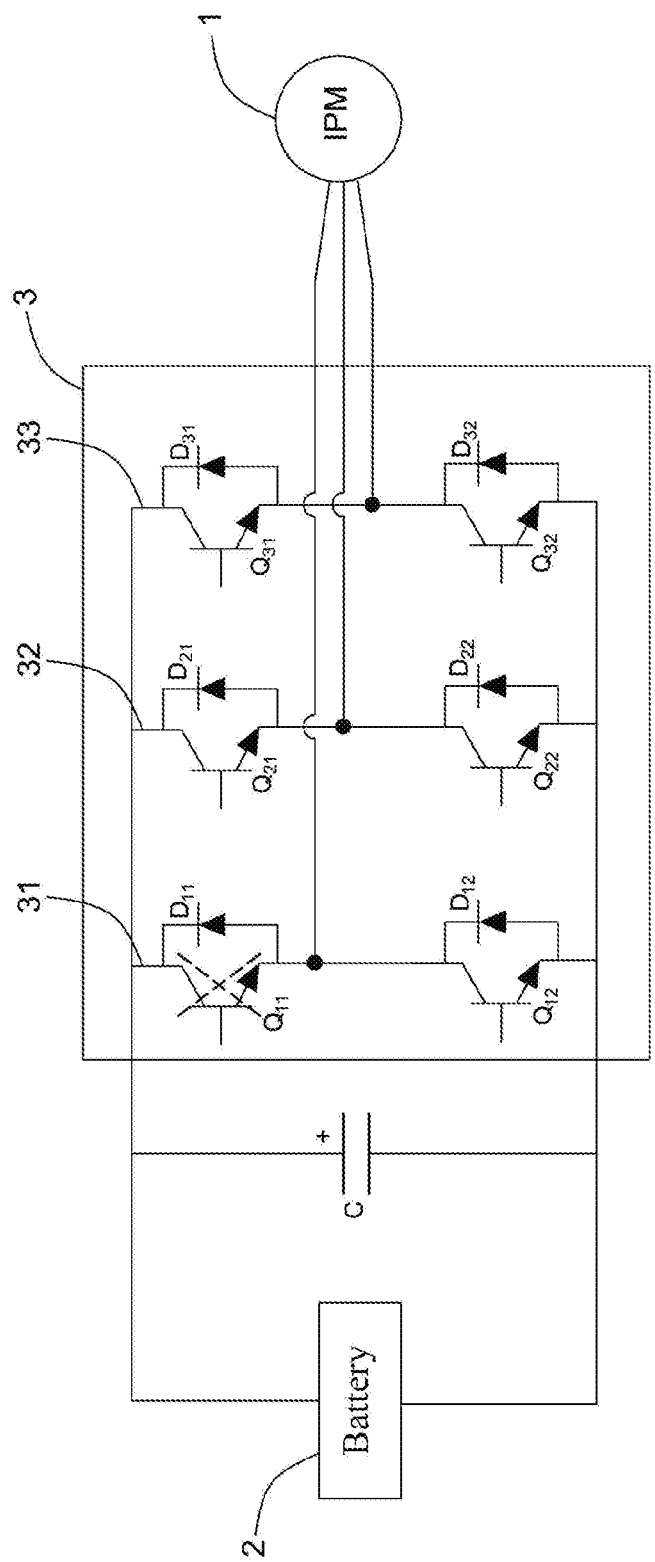
FIG. 2 is a schematic diagram in which an open circuit fault occurs in one of transistors in an inverter shown in FIG. 1.
Figure 3:
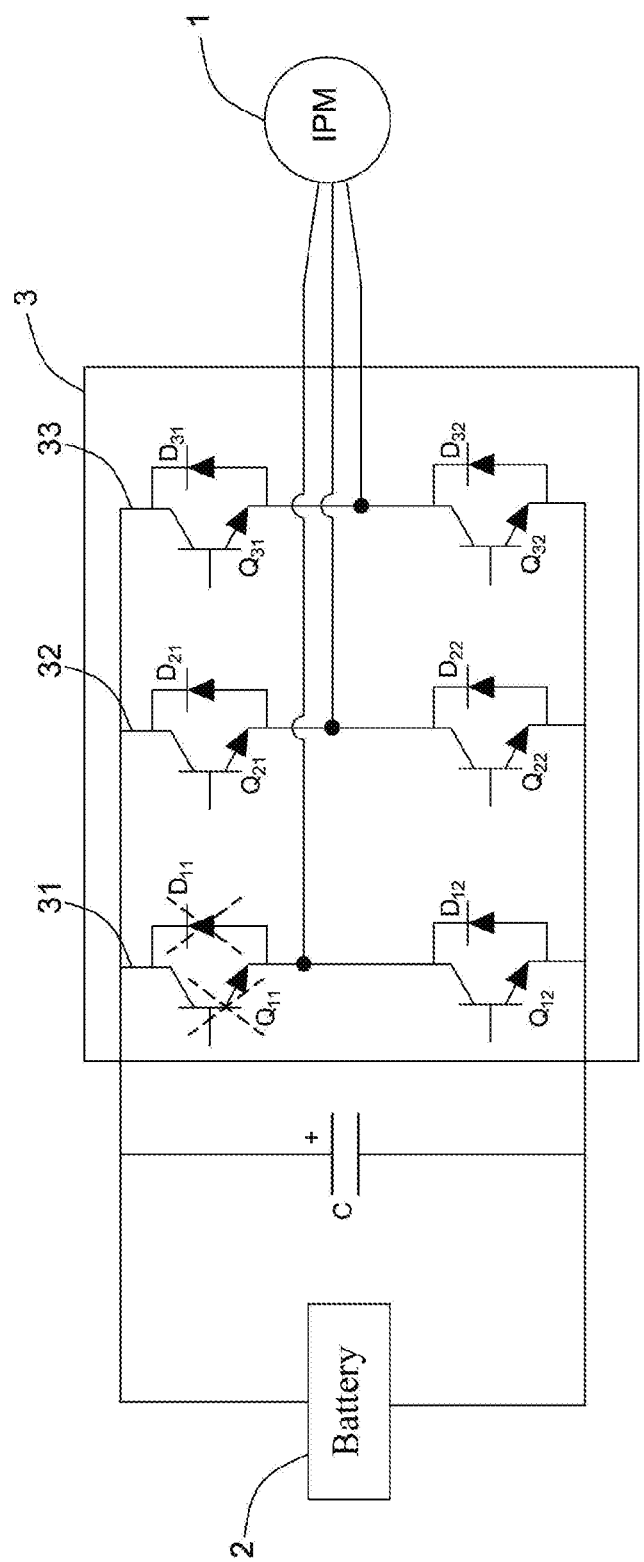
FIG. 3 is a schematic diagram in which a fault occurs in both one of transistors and a diode connected to the transistor in anti-parallel in an inverter shown in FIG. 1.

During the running of the vehicle, when an open circuit fault occurs in one of the transistors in the inverter 3, the controller 4 can control the inverter 3 to maintain driving force of the vehicle in a fault-tolerant manner, so as to control the vehicle to drive in such a mode as a limp-home mode or the like. The case in which an open circuit fault occurs in one of the transistors in the inverter 3 mentioned in the present invention at least includes: an open circuit fault occurs in only one transistor (for example, transistor $Q_{11}$) in the inverter 3 shown in FIG. 2, and an open circuit fault occurs in both one of the transistors (for example, transistor $Q_{11}$) and a diode (for example, diode $D_{11}$) connected to the transistor in anti-parallel.

Continue to refer to FIG. 1, if a measured vehicle speed $V_{act}$ is greater than a predetermined speed threshold $V_{th}$, the controller 4 of the present invention may remove a gate driver signal provided to all the transistors of the inverter 3. In this case, the vehicle can only regeneratively brake, and the vehicle can reduce the vehicle speed by inertial driving or regenerative braking. When the controller 4 removes the gate driver signal on all the transistors, the inverter 3 acts as a diode rectifier. When the diode is in ON state, a battery 1 is connected to a stator of the AC electric machine 1. Since a voltage drop of the stator of the AC electric machine 1 is reduced, a DC voltage $U_{dc}$ provided by the battery 1 may reduce an effect of counter electromotive force of the AC electric machine 1 on the stator current of the AC electric machine 1, and the current stress on the stator of the AC electric machine 1 can be reduced.

As the vehicle speed $V_{act}$ decreases due to inertial driving or regenerative braking of the vehicle, if the measured vehicle speed $V_{act}$ decreases to be less than the predetermined speed threshold $V_{th}$, the controller 4 of the present invention may maintain control of healthy transistors $Q_{12}$, $Q_{21}$, $Q_{22}$, $Q_{31}$, and $Q_{32}$. An actual vehicle speed $V_{act}$ may be obtained according to a rotational speed $V_{motor}$ of the AC electric machine 1. For example, the rotational speed $V_{motor}$ of the AC electric machine 1 may be measured by a speed sensor (not shown), and the rotational speed $V_{motor}$ of the AC electric machine 1 is transferred to the controller 4, and the controller 4 can calculate the current actual vehicle speed $V_{act}$ based on the rotational speed $V_{motor}$ of the AC electric machine 1. The predetermined speed threshold $V_{th}$ is relevant to the DC voltage $U_{dc}$ provided by the battery 2. The predetermined speed threshold $V_{th}$ is a function of the DC voltage $U_{dc}$ provided by the battery 2, and the predetermined speed threshold $V_{th}$ is directly proportional to the DC voltage $U_{dc}$ provided by the battery 2. When the DC voltage $U_{dc}$ provided by the battery 2 is relatively large, the predetermined speed threshold $V_{th}$ is also set to be relatively high; and when the DC voltage $U_{dc}$ provided by the battery 2 is relatively small, the predetermined speed threshold $V_{th}$ is set accordingly to be relatively low.

How the controller 4 of the present invention maintains control of healthy transistors $Q_{12}$, $Q_{21}$, $Q_{22}$, $Q_{31}$, and $Q_{32}$ when the measured vehicle speed $V_{act}$ decreases to be less than the predetermined speed threshold $V_{th}$ will be described in detail below with reference to FIGS. 1, 4, and 5.

Figure 4:
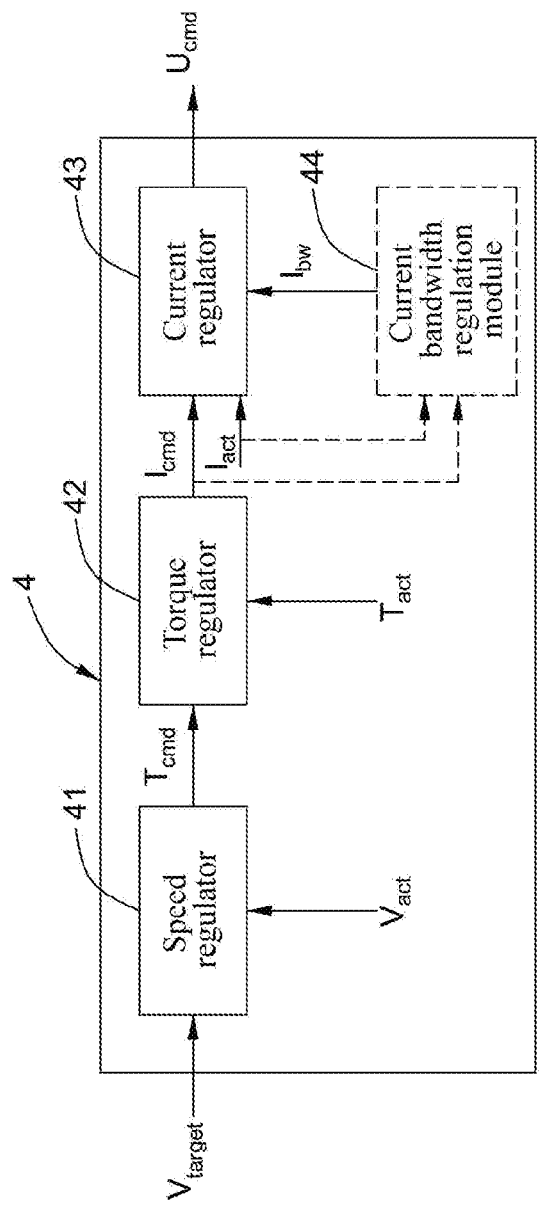
FIG. 4 is a schematic block diagram of a controller of a vehicle shown in FIG. 1.

FIG. 4 is a schematic block diagram of the controller 4 of the vehicle of the present invention. As shown in FIG. 4, the controller 4 may include a speed regulator 41, a torque regulator 42, and a current regulator 43.

The speed regulator 41 may receive the measured actual vehicle speed $V_{act}$ and a target vehicle speed $V_{target}$, and generate a torque command $T_{cmd}$ of the AC electric machine 1 based on the actual vehicle speed $V_{act}$ and the target vehicle speed $V_{target}$. The speed regulator 41 may include, for example, but is not limited to, a proportional integral (PI) regulator, and the speed regulator 41 calculates the torque command $T_{cmd}$ of the AC electric machine 1 according to the following formula (1).

$$T_{cmd} = \left(K_{p1} + \frac{K_{i1}}{S}\right) \times \Delta V = \left(K_{p1} + \frac{K_{i1}}{S}\right) \times (V_{target} - V_{act}) \quad (1)$$

In formula (1), $K_{p1}$ and $K_{i1}$ are the proportion and the integral coefficient respectively.

The torque regulator 42 may receive the torque command $T_{cmd}$ of the AC electric machine 1 from the speed regulator 41 and receive an actual torque $T_{act}$. The actual torque $T_{act}$ of the AC electric machine 1 may be obtained according to the actual current $I_{act}$ of the stator of the AC electric machine 1. For example, the actual current $I_{act}$ of the stator of the AC electric machine 1 may be measured first by a current measuring device (not shown), and then the actual current $I_{act}$ of the stator of the AC electric machine 1 is transmitted to the controller 4, and the controller 4 may calculate the actual torque $T_{act}$ based on the actual current $I_{act}$ of the stator of the AC electric machine 1. The torque regulator 42 may generate the current command $I_{cmd}$ of the stator of the AC electric machine 1 based on the torque command $T_{cmd}$ and the actual torque $T_{act}$ of the AC electric machine 1. The torque regulator 42 may include, but is not limited to, for example, a proportional integral (PI) regulator, and the torque regulator 42 calculates the current command $T_{cmd}$ of the stator of the AC electric machine 1 according to the following formula (2).

$$I_{cmd} = \left(K_{p2} + \frac{K_{i2}}{S}\right) \times \Delta T = \left(K_{p2} + \frac{K_{i2}}{S}\right) \times (T_{cmd} - T_{act}) \quad (2)$$

In formula (2), $K_{p2}$ and $K_{i2}$ are the proportion and the integral coefficient respectively.

The current regulator 43 may receive the current command $I_{cmd}$ from the stator of the AC electric machine 1 of the torque regulator 42 and receive the actual current $I_{act}$ of the stator and generate a voltage command $U_{cmd}$ of the stator of the AC electric machine 1 based on the current command $I_{cmd}$ of the stator of the AC electric machine 1 and the actual current $I_{act}$ of the stator. The current regulator 43 may include, but is not limited to, for example, a proportional integral (PI) regulator, and the current regulator 43 calculates the voltage command $U_{cmd}$ of the stator of the AC electric machine 1 according to the following formula (3).

$$U_{cmd} = \left(K_{p3} + \frac{K_{i3}}{S}\right) \times \Delta I = \left(K_{p3} + \frac{K_{i3}}{S}\right) \times (I_{cmd} - I_{act}) \quad (3)$$

In formula (3), $K_{p3}$ and $K_{i3}$ are the proportion and the integral coefficient respectively.

The controller 4 controls the healthy transistors $Q_{12}$, $Q_{21}$, $Q_{22}$, $Q_{31}$, and $Q_{32}$ in the inverter 3 based on the voltage command $U_{cmd}$ of the stator of the AC electric machine 1.

Referring back to FIG. 1, the vehicle further includes a gate driver 5. The gate driver 5 is connected to all the transistors of the inverter 3 and is in communication with the controller 4, and the controller 4 can control the gate driver 5. The controller 4 sends the generated voltage command $U_{cmd}$ of the stator of the AC electric machine 1 to the gate driver 5. The gate driver 5 generates a pulse width modulation signal $S_{PWM}$ according to the voltage command $U_{cmd}$ of the stator of the AC electric machine 1, and then the pulse width modulation signal $S_{PWM}$ is sent as a gate driver signal to the healthy transistors $Q_{12}$, $Q_{21}$, $Q_{22}$, $Q_{31}$, and $Q_{32}$ in the inverter 3. The healthy transistors $Q_{12}$, $Q_{21}$, $Q_{22}$, $Q_{31}$, and $Q_{32}$ perform corresponding switch-on and switch-off operations according to the received pulse width modulation signal $S_{PWM}$.

In a specific embodiment of the present invention, with continued reference to FIG. 4, the controller 4 of the present invention may further include a current bandwidth regulation module 44. The current bandwidth regulation module 44 may receive the actual current $I_{act}$ of the stator and the current command $I_{cmd}$ of the stator of the AC electric machine 1 of the torque regulator 42, and generate an adaptive current bandwidth $I_{bw}$ of the stator of the AC electric machine 1 according to the current command $I_{cmd}$ and the actual current $T_{act}$ of the stator of the AC electric machine 1. In a specific embodiment in which the controller 4 includes a current bandwidth regulation module 44, the current regulator 44 may receive the actual current $I_{act}$ of the stator and the current command $I_{cmd}$ of the stator of the AC electric machine 1 generated from the torque regulator 42, the current regulator 44 may further receive the adaptive current bandwidth $I_{bw}$ of the stator of the AC electric machine 1 generated by the current bandwidth regulation module 44, and then the current regulator 44 may generate the voltage command $U_{cmd}$ of the stator of the AC electric machine 1 based on the current command $I_{cmd}$ and the actual current last of the stator of the AC electric machine 1, and the generated adaptive current bandwidth $I_{bw}$.

Figure 5:
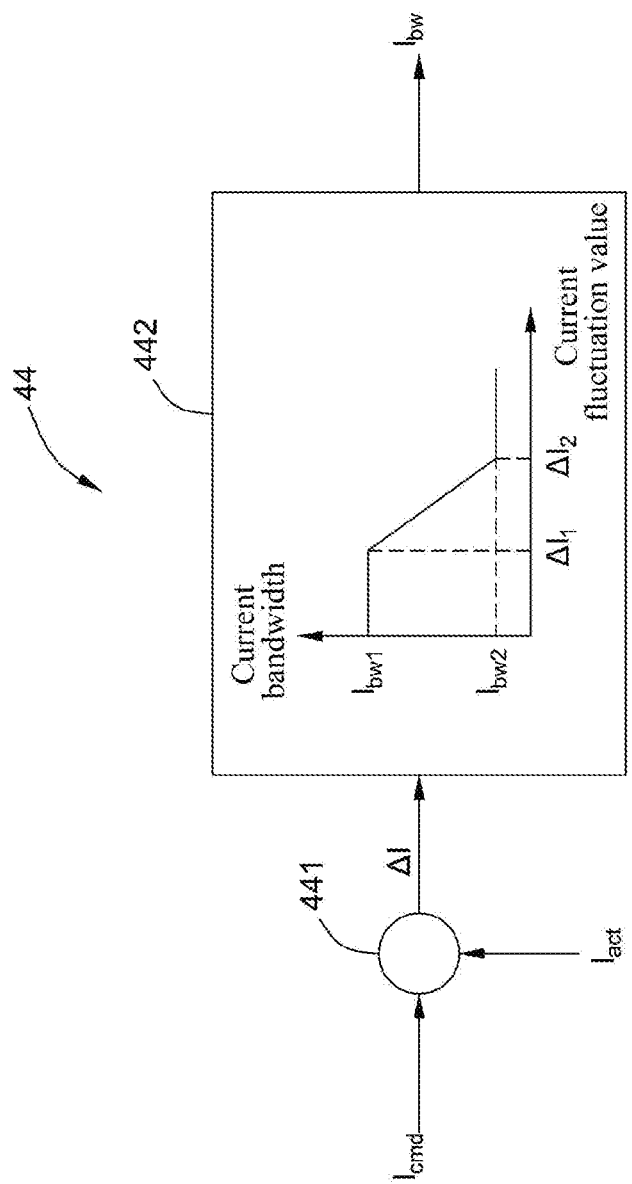
FIG. 5 is a schematic diagram of a current bandwidth regulation module in a controller shown in FIG. 4.

FIG. 5 shows a schematic diagram of the current bandwidth regulation module 44. As shown in FIG. 5, the current bandwidth regulation module 44 may include a subtracter 441. The subtracter 441 receives the actual current $T_{act}$ of the stator of the AC electric machine 1 and the current command $I_{cmd}$ of the stator of the AC electric machine 1 generated from the torque regulator 42, and calculates a current difference $\Delta I$ between the current command $I_{cmd}$ and the actual current last of the stator of the AC electric machine 1. This is shown in the following formula (4).

$$\Delta I = I_{cmd} - I_{act} \quad (4)$$

When the current difference $\Delta I$ between the current command $I_{cmd}$ and the actual current last of the stator of the AC electric machine 1 is greater than a preset current fluctuation value (for example, a first current fluctuation value $\Delta I_1$ shown in FIG. 5), the current bandwidth regulation module 44 may reduce a current bandwidth of the stator of the AC electric machine 1 and use the reduced current bandwidth of the stator of the AC electric machine 1 as the generated adaptive current bandwidth $I_{bw}$ of the stator.

A first current bandwidth $I_{bw1}$, a second current bandwidth $I_{bw2}$, a first current fluctuation value $\Delta I_1$, and a second current fluctuation value $\Delta I_2$ are preset in the current bandwidth regulation module 44, the first current bandwidth $I_{bw1}$ being greater than the second current bandwidth $I_{bw2}$, and the first current fluctuation value $\Delta I_1$ being less than the second current fluctuation value $\Delta I_2$. As an example, a relationship curve 442 between the current bandwidth and the current fluctuation value is preset in the current bandwidth regulation module 44. The first current bandwidth $I_{bw1}$, the second current bandwidth $I_{bw2}$, the first current fluctuation value $\Delta I_1$, and the second current fluctuation value $\Delta I_2$ may be determined according to the relationship curve 442 between the current bandwidth and the current fluctuation value. The current bandwidth regulation module 44 can determine the adaptive current bandwidth $I_{bw}$ of the stator of the AC electric machine 1 according to the calculated current difference $\Delta I$ with reference to the relationship curve 442 between the current bandwidth and the current fluctuation value.

Specifically, when the current difference $\Delta I$ between the current command $I_{cmd}$ and the actual current $I_{act}$ of the stator of the AC electric machine 1 is less than the first current fluctuation value $\Delta I_1$, the adaptive current bandwidth $I_{bw}$ generated by the current bandwidth regulation module 44 is equal to the first current bandwidth $I_{bw1}$. This is shown in the following formula (5).

$$I_{bw}=I_{bw1}(\Delta I<\Delta I_1) \tag{5}$$

When the current difference $\Delta I$ between the current command $I_{cmd}$ and the actual current $I_{act}$ of the stator of the AC electric machine 1 is between first current fluctuation value $\Delta I_1$ and the second current fluctuation value $\Delta I_2$, the adaptive current bandwidth $I_{bw}$ generated by the current bandwidth regulation module 44 is between the first current bandwidth $I_{bw1}$ and the second current bandwidth $I_{bw2}$. This is specifically shown in the following formula (6).

$$I_{bw} = I_{bw1} + \frac{I_{bw2} - I_{bw1}}{\Delta I_2 - \Delta I_1} \times (\Delta I - \Delta I_1)(\Delta I_1 \le \Delta I \le \Delta I_2) \tag{6}$$

When the current difference $\Delta I$ between the current command $I_{cmd}$ and the actual current $I_{act}$ of the stator of the AC electric machine 1 is greater than the second current fluctuation value $\Delta I_2$, the adaptive current bandwidth $I_{bw}$ generated by the current bandwidth regulation module 44 is equal to the second current bandwidth $I_{bw2}$. This is shown in the following formula (7).

$$I_{bw}=I_{bw2}(\Delta I \ge \Delta I_2) \tag{7}$$

The current regulator 43 may adjust the proportional and integral coefficient $K_{p3}$, and $K_{i3}$ in the above formula (3) according to the adaptive current bandwidth $I_{bw}$ generated by the current bandwidth regulation module 44, and generate the corresponding voltage command $U_{cmd}$ of the stator according to the current difference $\Delta I$ between the current command $I_{cmd}$ and the actual current $I_{act}$ of the stator of the AC electric machine 1, so as to reduce torque ripple of the AC electric machine 1.

When a fault occurs in the inverter 3, the vehicle of the present invention can realize appropriate fault-tolerant control of the transistors in the inverter 3 according to a current actual speed $V_{act}$ of the vehicle. Therefore, the vehicle of the present invention can drive by its own driving force to a vehicle maintenance point without the help of a trailer, thereby reducing maintenance costs of the vehicle.

In addition, when a fault occurs in the inverter 3, by means of appropriate fault-tolerant control of the inverter 3 by the controller 4 of the present invention, the vehicle of the present invention can prevent a high current from being generated on the stator side of the AC electric machine 1 when a fault occurs in the inverter 3, reducing the current stress on the stator side. Furthermore, the vehicle of the present invention can reduce the torque ripple of the AC electric machine 1 when a fault occurs in the inverter 3.

Figure 6:
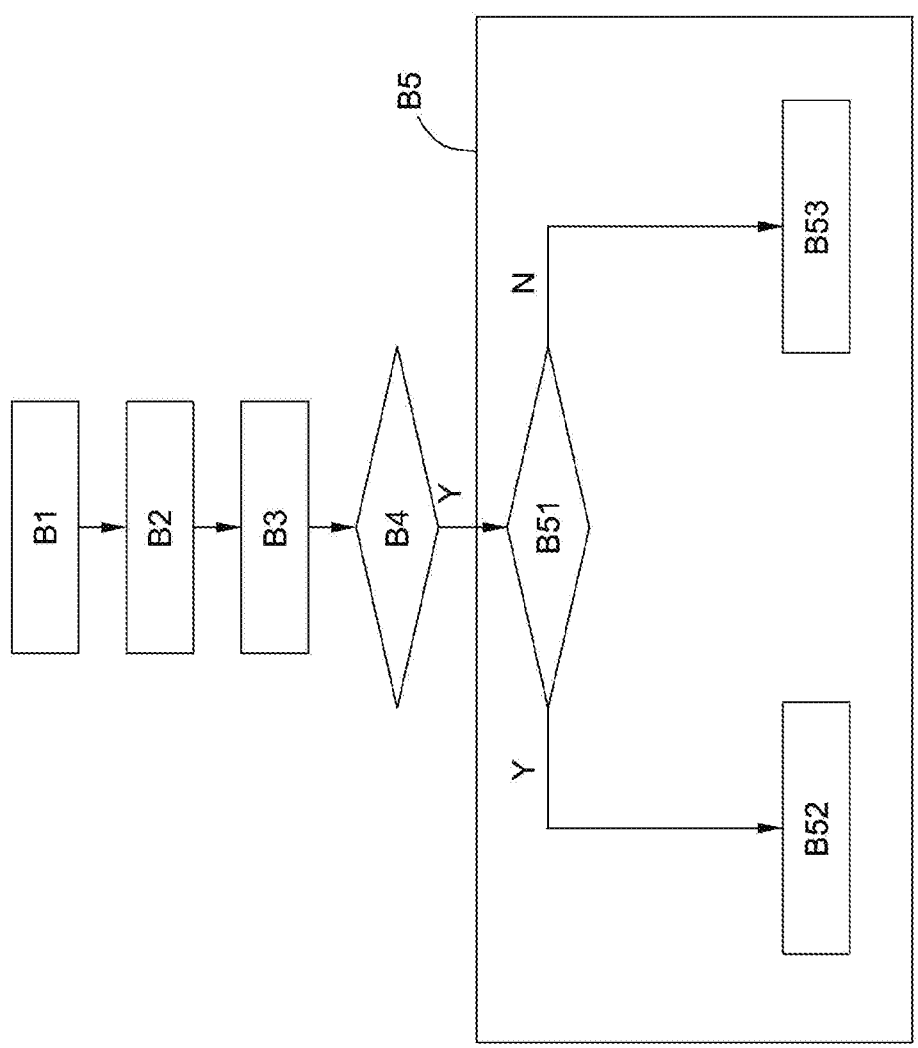
FIG. 6 is a schematic flowchart of a control method of a vehicle according to a specific embodiment of the present invention.

The present invention further provides a control method of a vehicle. FIG. 6 shows a schematic flowchart of a control method of a vehicle according to a specific embodiment of the present invention. The control method of a vehicle may include the following steps.

As shown in FIG. 6, in step B1, for example, a DC voltage $U_{dc}$ may be provided by a battery 2.

In step B2, the DC voltage $U_{dc}$ can be converted by the inverter 3 to an AC voltage to drive the AC electric machine 1, for example an IPM.

In step B3, traction drive force may be generated by the AC electric machine 1 to drive the vehicle.

In step B4, whether an open circuit fault occurs in any one of the transistors in the inverter 3 during the running of the vehicle is monitored. When an open circuit fault occurs in any one (for example, the transistor $Q_{11}$) of the transistors in the inverter 3, the process can proceed to step B5.

In step B5, the inverter 3 may be controlled by the controller 4 to maintain the vehicle to drive in a fault-tolerant mode. Specifically, in step B51, whether the measured actual vehicle speed $V_{act}$ is greater than a predetermined speed threshold $V_{th}$ is monitored. When the measured actual vehicle speed $V_{act}$ is greater than the predetermined speed threshold $V_{th}$, the process can proceed to step B52. When the measured actual vehicle speed $V_{act}$ is less than the predetermined speed threshold $V_{th}$, the process can proceed to step B53.

In step B52, when the measured vehicle speed $V_{act}$ is greater than the predetermined speed threshold $V_{th}$, for example, the controller 4 is used to remove a gate driver signal provided to all the transistors of the inverter 3.

In step B53, when the measured vehicle speed $V_{act}$ is less than the predetermined speed threshold $V_{th}$, for example, the controller 4 is used to maintain control of healthy transistors ($Q_{12}$, $Q_{21}$, $Q_{22}$, $Q_{31}$, and $Q_{32}$).

How the controller 4 maintains control of healthy transistors in step B53 of FIG. 6 will be described in detail below with reference to FIG. 7.

Figure 7:
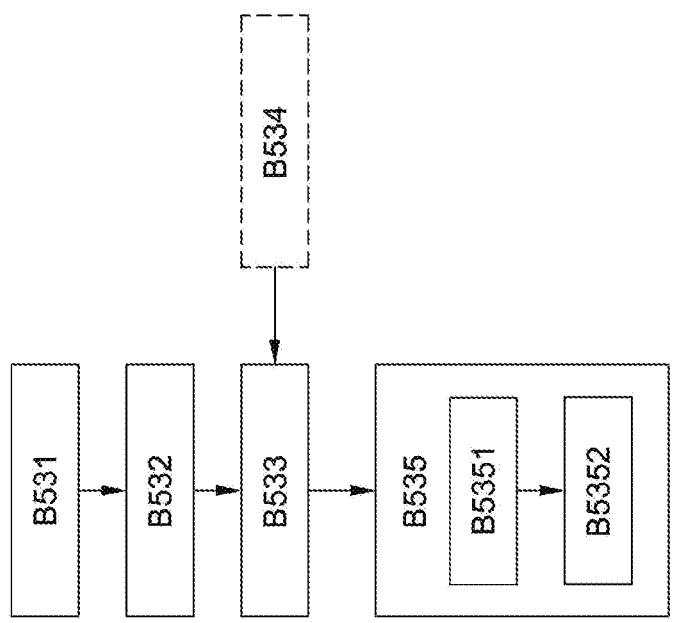
FIG. 7 shows steps of maintaining control of a healthy transistor shown in FIG. 6.

As shown in FIG. 7, in step B531, a torque command $T_{cmd}$ of the AC electric machine 1 may be generated based on the measured vehicle speed $V_{act}$ and the target vehicle speed $V_{target}$, for example, as shown in the above formula (1).

In step B532, the current command $T_{cmd}$ of the stator of the AC electric machine 1 may be generated based on the torque command $T_{cmd}$ of the AC electric machine 1 and the actual torque $T_{act}$, as shown in the above formula (2).

In step B533, the voltage command $U_{cmd}$ of the stator of the AC electric machine 1 may be generated based on the current command $T_{cmd}$ of the stator of the AC electric machine 1 and the actual current $I_{act}$ of the stator, for example, as shown in the above formula (3). Then, the process can proceed to step B535.

The step B53 of maintaining control of healthy transistors shown in FIG. 6 may further include the following step B534. In step B534, the adaptive current bandwidth $I_{bw}$ of the stator of the AC electric machine 1 can be generated based on the current command $T_{cmd}$ of the stator of the AC electric machine 1 and the actual current $I_{act}$. In this case, in step B533, the voltage command $U_{cmd}$ of the stator of the AC electric machine 1 may further be generated based on the adaptive current bandwidth $I_{bw}$ of the stator generated in step B534. The generating the adaptive current bandwidth $I_{bw}$ in step B534 may include: when the current difference $\Delta I$ between the current command $T_{cmd}$ and the actual current Let of the stator of the AC electric machine 1 is greater than a preset current fluctuation value (for example, the first current fluctuation value $\Delta I_1$ shown in FIG. 5), the current bandwidth of the stator of the AC electric machine 1 is reduced, and the reduced current bandwidth of the stator of the AC electric machine 1 is used as the generated adaptive current bandwidth $I_{bw}$ of the stator. The generation of the adaptive current bandwidth $I_{bw}$ in step B534 can be specifically referred to the above formula (5) to formula (7). Details are not described herein.

In step B535, healthy transistors in the inverter 3 can be controlled according to the voltage command $U_{cmd}$ of the stator of the AC electric machine 1. Step B535 may include the following steps.

In step B5351, the pulse width modulation signal $S_{PWM}$ may be generated based on the voltage command $U_{cmd}$ of the stator of the AC electric machine 1.

In step B5352, the pulse width modulation signal $S_{PWM}$ may be sent to healthy transistors in the inverter 3, and the healthy transistors may perform corresponding switch-on and switch-off operations according to the received pulse width modulation signal $S_{PWM}$.

In the control method of the present invention, during normal operation of the vehicle, the controller 4 controls the gate driver 5 to provide a first gate driver signal to turn on the transistors of the inverter 3 to generate an AC voltage for driving the operation of the AC electric machine 1. When a fault occurs in the vehicle (an open circuit fault occurs in one of the transistors in the inverter of the vehicle in a specific embodiment of the present invention), the controller 4 controls, in response to the open circuit fault, the gate driver 5 to remove the first gate driver signal provided to all the transistors of the inverter 3 when the measured vehicle speed $V_{act}$ is greater than the predetermined speed threshold $V_{th}$, and controls the gate driver 5 to provide a different second gate driver signal to turn on healthy transistors of the inverter 3 to generate a different second AC voltage that is sufficient to drive the AC electric machine 1 to move the vehicle when the measured vehicle speed $V_{act}$ is less than the predetermined speed threshold $V_{th}$.

In the control method of the present invention, when an open circuit fault occurs in the inverter 3 of the vehicle, appropriate fault-tolerant control of the transistors of the inverter 3 can be performed according to the actual vehicle speed $V_{act}$. Therefore, the vehicle can drive by its own driving force to a vehicle maintenance point without the help of a trailer, thereby reducing maintenance costs of the vehicle.

In addition, in the control method of the present invention, when an open circuit fault occurs in the inverter 3 of the vehicle, appropriate fault-tolerant control of the inverter 3 is performed, so as to prevent a high current from being generated on the stator side of the AC electric machine 1, reducing the current stress on the stator side. Furthermore, the control method of the vehicle of the present invention can further reduce the torque ripple of the AC electric machine 1.

Furthermore, the fault-tolerant control technology of the present invention can be applied to not only a vehicle but also to a field application other than a vehicle, such as an industrial machine driven by a motor. Therefore, the present invention further provides a system. The system includes an AC electric machine 1 configured to generate driving force, a DC bus (for example, the battery 2 shown in the drawings of the present invention) configured to provide a DC voltage $U_{dc}$, an inverter 3, and a controller 4. The inverter 3 is coupled with the battery 2 and configured to convert the DC voltage from the battery 2 to an AC voltage to drive the AC electric machine 1, and the inverter 3 includes a plurality of transistors. The controller 4 is configured to control the inverter 3 to maintain the AC electric machine 1 to operate in a fault-tolerant mode when an open circuit fault occurs in one of the transistors in the inverter 3 during operating of the AC electric machine 1.

In consideration of not only application for vehicle applications, but also applications other than vehicles, the controller 4 may use a rotational speed of the AC electric machine 1 instead of a vehicle speed of the vehicle as a determination criterion. Therefore, the controller 4 is configured to remove a gate driver signal provided to all the transistors of the inverter 3 if a rotational speed of the AC electric machine 1 is greater than a predetermined speed threshold, and maintain control of healthy transistors if the rotational speed of the AC electric machine 1 is less than the predetermined speed threshold.

Similarly, the controller may include a speed regulator 41, a torque regulator 42, and a current regulator 43. The speed regulator 41 is configured to generate a torque command $T_{cmd}$ of the AC electric machine 1 based on the rotational speed and a target rotational speed of the AC electric machine 1. The torque regulator 42 is configured to generate a current command $I_{cmd}$ of a stator of the AC electric machine 1 based on the torque command $T_{cmd}$ and an actual torque $T_{act}$ of the AC electric machine 1. The current regulator 43 is configured to generate a voltage command $U_{cmd}$ of the stator of the AC electric machine 1 based on the current command $I_{cmd}$ and an actual current $I_{act}$ of the stator of the AC electric machine 1. The controller 4 controls the healthy transistors of the inverter 3 based on the voltage command $U_{cmd}$ of the stator of the AC electric machine 1.

Similarly, the controller may further include a current bandwidth regulation module 44. The current bandwidth regulation module 44 generates an adaptive current bandwidth $I_{bw}$ of the stator of the AC electric machine 1 based on the current command $I_{cmd}$ and the actual current $I_{act}$ of the stator of the AC electric machine 1. In this case, the current regulator 43 is configured to generate the voltage command $U_{cmd}$ of the stator of the AC electric machine 1 based on the current command $I_{cmd}$ and the actual current $I_{act}$ of the stator of the AC electric machine 1, and the generated adaptive current bandwidth $I_{bw}$. The generation of the adaptive current bandwidth $I_{bw}$ may refer to the foregoing description, and details are not described herein any more.

When a fault occurs in the inverter 3 of the system, appropriate fault-tolerant control of transistors of the inverter 3 can be performed according to an actual rotational speed of the AC electric machine 1, so as to continue to maintain the operation of the AC electric machine 1.

When the fault-tolerant control technology of the present invention is applied to the vehicle field, the vehicle may include the above system, and the AC electric machine is an AC traction motor.

While the present invention has been described in detail with reference to specific embodiments thereof, it will be understood by those skilled in the art that many modifications and variations can be made in the present invention. It is, therefore, to be understood that the appended claims are intended to cover all such modifications and variations insofar as they are within the true spirit and scope of the invention.

The invention claimed is:
1. A vehicle comprising:
  an AC electric machine;
  a DC bus configured to provide a DC voltage;
  an inverter coupled to the DC bus and configured to convert the DC voltage from the DC bus to an AC voltage to drive the AC electric machine, the inverter comprising a plurality of transistors; and
  a controller configured to control the inverter when an open circuit fault occurs in one of the transistors in the inverter, controlling the inverter comprising:
    removing a gate driver signal provided to the transistors when a measured vehicle speed is greater than a predetermined speed threshold; and
    maintaining a control of healthy transistors based on a voltage command of a stator of the AC electric machine when the measured vehicle speed is less than the predetermined speed threshold.

2. The vehicle of claim 1, wherein:
the AC electric machine is a three-phase AC motor; and
the inverter comprises three bridge arms, each bridge arm having two transistors coupled in series, each transistor being connected in anti-parallel with a diode.

3. The vehicle of claim 1, wherein the predetermined speed threshold is associated with the DC voltage provided by the DC bus.

4. The vehicle of claim 1, wherein the controller comprises:
a speed regulator configured to generate a torque command of the AC electric machine based on the measured vehicle speed and a target vehicle speed;
a torque regulator configured to generate a current command of the stator based on the torque command and an actual torque of the AC electric machine; and
a current regulator configured to generate the voltage command based on the current command and an actual current of the stator.

5. The vehicle of claim 4, further comprising:
a gate driver coupled to the plurality of transistors of the inverter;
the controller further configured to control the gate driver to generate a pulse width modulation signal to send as a gate driver signal to the healthy transistors based on the voltage command.

6. The vehicle of claim 4, wherein the controller further comprises:
a current bandwidth regulation module configured to generate an adaptive current bandwidth of the stator based on the current command and the actual current;
the current regulator being further configured to generate the voltage command based on the current command, the actual current, and the adaptive current bandwidth.

7. The vehicle of claim 6, wherein the current bandwidth regulation module is configured to reduce a current bandwidth of the stator when a current difference between the current command and the actual current is greater than a preset current fluctuation value.

8. The vehicle of claim 6, wherein:
a first current bandwidth, a second current bandwidth, a first current fluctuation value, and a second current fluctuation value are preset in the current bandwidth regulation module, the first current bandwidth being greater than the second current bandwidth and the first current fluctuation value being less than the second current fluctuation value;
when a current difference between the current command and the actual current is less than the first current fluctuation value, the adaptive current bandwidth is equal to the first current bandwidth;
when the current difference between the current command and the actual current is greater than the second current fluctuation value, the adaptive current bandwidth is equal to the second current bandwidth; and
when the current difference between the current command and the actual current is between the first and second current fluctuation values, the adaptive current bandwidth is between the first and second current bandwidths.

9. A control method of a vehicle comprising:
providing a DC voltage;
converting, by an inverter having a plurality of transistors, the DC voltage to an AC voltage to drive an AC electric machine;
and
controlling the inverter when an open circuit fault occurs in one of the transistors in the inverter by:
removing a gate driver signal provided to the transistors when a measured vehicle speed is greater than a predetermined speed threshold; and
maintaining a control of healthy transistors based on a voltage command of a stator of the AC electric machine when the measured vehicle speed is less than the predetermined speed threshold.

10. The control method of claim 9, wherein maintaining the control of the healthy transistors comprises:
generating a torque command of the AC electric machine based on the measured vehicle speed and a target vehicle speed;
generating a current command of the stator based on the torque command and an actual torque of the AC electric machine; and
generating the voltage command based on the current command and an actual current of the stator.

11. The control method of claim 10, wherein maintaining the control of the healthy transistors further comprises:
generating an adaptive current bandwidth of the stator based on the current command and the actual current, wherein the voltage command is generated further based on the adaptive current bandwidth.

12. The control method of claim 11, wherein generating the adaptive current bandwidth comprises reducing a current bandwidth of the stator when a current difference between the current command and the actual current is greater than a preset current fluctuation value.

13. The control method of claim 9, wherein:
converting the DC voltage to the AC voltage comprises controlling, by a controller, a gate driver to provide a first gate driver signal to turn on the transistors of the inverter to generate the AC voltage; and
controlling the inverter when an open circuit fault occurs in one of the transistors in the inverter further comprises:
controlling the gate driver to remove the first gate driver signal provided to all of the transistors of the inverter when a measured vehicle speed is greater than a predetermined speed threshold; and
controlling the gate driver to provide a second gate driver signal to turn on healthy transistors of the inverter to generate a second AC voltage that is sufficient to drive the AC electric machine to move the vehicle when the measured vehicle speed is less than the predetermined speed threshold.

14. A system comprising:
an AC electric machine;
a DC bus configured to provide a DC voltage;
an inverter coupled to the DC bus and configured to convert the DC voltage from the DC bus to an AC voltage to drive the AC electric machine, the inverter comprising a plurality of transistors; and
a controller configured to control the inverter when an open circuit fault occurs in one of the transistors in the inverter, controlling the inverter comprising:
removing a gate driver signal provided to the transistors when a measured rotational speed of the AC electric machine is greater than a predetermined speed threshold; and
maintaining a control of healthy transistors based on a voltage command of a stator of the AC electric machine when the measured rotational speed is less than the predetermined speed threshold.

15. The system of claim 14, wherein the controller comprises:
- a speed regulator configured to generate a torque command of the AC electric machine based on the rotational speed and a target rotational speed;
- a torque regulator configured to generate a current command of the stator based on the torque command and an actual torque of the AC electric machine; and
- a current regulator configured to generate the voltage command based on the current command and an actual current of the stator.

16. The system of claim 15, wherein the controller further comprises:
- a current bandwidth regulation module configured to generate an adaptive current bandwidth of the stator based on the current command and the actual current;
- the current regulator being further configured to generate the voltage command based on the current command, the actual current, and the adaptive current bandwidth.

17. The system of claim 14, wherein the AC electric machine is an AC traction motor.

* * * * *